US010698802B1

(12) United States Patent
Ovadia

(10) Patent No.: US 10,698,802 B1
(45) Date of Patent: Jun. 30, 2020

(54) METHOD AND SYSTEM FOR GENERATING A VALIDATION TEST

(71) Applicant: Cadence Design Systems, Inc., San Jose, CA (US)

(72) Inventor: Meir Ovadia, Rosh Ha-Ayin (IL)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 0 days.

(21) Appl. No.: 15/927,430

(22) Filed: Mar. 21, 2018

(51) Int. Cl.
*G06F 9/44* (2018.01)
*G06F 11/36* (2006.01)
*G06F 9/52* (2006.01)
*G06F 30/3323* (2020.01)

(52) U.S. Cl.
CPC .......... *G06F 11/3684* (2013.01); *G06F 9/522* (2013.01); *G06F 30/3323* (2020.01)

(58) Field of Classification Search
CPC ..... G06F 9/522; G06F 11/3684; G06F 17/504
USPC .................................................. 717/124–135
See application file for complete search history.

(56) References Cited

U.S. PATENT DOCUMENTS

| | | | | | |
|---|---|---|---|---|---|
| 5,870,588 | A * | 2/1999 | Rompaey | ............ | G06F 17/5022 703/13 |
| 6,634,008 | B1 * | 10/2003 | Dole | .................. | G06F 17/5045 707/999.01 |
| 7,275,231 | B2 * | 9/2007 | Murthy | ............... | G06F 17/5009 716/106 |
| 7,669,015 | B2 * | 2/2010 | Dice | ........................ | G06F 9/466 711/152 |
| 8,640,084 | B2 * | 1/2014 | Murthy | ............... | G06F 11/3684 717/104 |
| 8,924,269 | B2 * | 12/2014 | Seubert | .................. | G06Q 10/06 705/35 |

OTHER PUBLICATIONS

Guerraoui et al., "Model Checking Transactional Memories", 2008, ACM, 11 pages (Year: 2008).*
Gladigau, "Combining Formal Model-Based System-Level Design with SystemC Transaction Level Modeling", 2012, Thesis, University Erlangen-Nuremberg, Erlangen, Germany, 202 pages. (Year: 2012).*

* cited by examiner

*Primary Examiner* — Ted T. Vo
(74) *Attorney, Agent, or Firm* — Pearl Cohen Zedek Latzer Baratz LLP

(57) ABSTRACT

A method for generating a validation test for testing an electronic design may include using a processor, analyzing a plurality of actions of a validated scenario to identify an executable corresponding to each of the actions and to identify one or a plurality of variables referred to by each of the actions; using a processor, identifying actions in said plurality of actions that correspond to different executables of the identified executables but refer to a same variable of said one or a plurality of variables that is to be written to or read from a shared memory assigned to the different executables; and using a processor, generating a test code for the validated scenario that includes one or a plurality of access protection commands to manage access by the identified actions that correspond to the different executables and refer to the same variable.

20 Claims, 5 Drawing Sheets

METHOD AND SYSTEM FOR GENERATING A VALIDATION TEST

FIELD OF THE INVENTION

The present invention relates to verification and more particularly to methods and systems for generating a validation test for testing an electronic design.

BACKGROUND

Design verification is a common process for testing a newly designed integrated circuit, board, or system-level architecture, to, for example, confirm that it complies with the requirements defined by the specification of the architecture for that device. Design verification for a device under test (DUT) may be performed on the actual device, but can usually be a simulation model of the device is tested.

Verification of electronic designs typically has three forms. At an early stage, before the electronic design is implemented in hardware, simulation can be conducted on a model of the design. Another form can be emulation, in which one electronic hardware is used to mimic the behavior of another (tested) electronic hardware. At more advanced stages of design development a system on chip can be validated, in a process which is typically referred to as post-silicon validation. Post-silicon validation can be a last stage in the electronic design development, for example, before it is manufactured.

Post-silicon validation tests can be carried out on actual devices running at speed on realistic system boards, the results of which can be assessed by a logic analyzer and other validation tools.

In a typical verification process an electronic design undergoes testing which includes designing various validated testing scenarios which are generated as code and executed.

SUMMARY

There is thus provided, according to some embodiments of the present invention, a method for generating a validation test for testing an electronic design. The method may include, using a processor, analyzing a plurality of actions of a validated scenario to identify an executable corresponding to each of the actions and to identify one or a plurality of variables referred to by each of the actions; using a processor, identifying actions in said plurality of actions that correspond to different executables of the identified executables but refer to a same variable of said one or a plurality of variables that is to be written to or read from a shared memory assigned to the different executables; and using a processor, generating a test code for the validated scenario that includes one or a plurality of access protection commands to manage access by the identified actions that correspond to the different executables and refer to the same variable.

According to some embodiments of the invention, the validated scenario is in the form of a directed graph.

According to some embodiments of the invention, the method also includes allocating the shared memory for the different executables.

According to some embodiments of the invention, the one or a plurality of access protection commands are included in the test code if the identified actions are to be executed concurrently.

According to some embodiments of the invention, the one or a plurality of access protection commands are included in the test code if one of the identified actions relates to a "write" command.

According to some embodiments of the invention, the one or a plurality of access protection commands comprises a "lock" command.

According to some embodiments of the invention, the one or a plurality of access protection commands are included in the test code if more than one of the identified actions relates to a "write" command.

According to some embodiments of the invention, the one or a plurality of access protection commands comprises an "exclusive lock" command and a corresponding "release" command.

According to some embodiments of the invention, there is provided a non-transitory computer readable storage medium for generating a validation test, having stored thereon instructions that when executed by a processor will cause the processor to: analyze a validated scenario that includes a plurality of actions to identify executables and variables relating to each of the actions; identify actions in the plurality of actions that relate to different executables and refer to a same variable of said variables that is to be written to or read from a shared memory assigned to the different executables; and generate a test code for the validated scenario that includes one or a plurality of access protection commands to manage access by the actions that relate to the different executables and refer to the same variable.

According to some embodiments of the invention, there is also provided a system for generating a validation test, that includes a memory and a processor configured: to analyze a plurality of actions of a validated scenario to identify an executable corresponding to each of the actions and to identify one or a plurality of variables referred to by each of the actions; to identify actions in said plurality of actions that correspond to different executables of the identified executables but refer to a same variable of said one or a plurality of variables that is to be written to or read from a shared memory assigned to the different executables; and to generate a test code for the validated scenario that includes one or a plurality of access protection commands to manage access by the identified actions that correspond to the different executables and refer to the same variable.

BRIEF DESCRIPTION OF THE DRAWINGS

In order to better understand the present invention, and appreciate its practical applications, the following figures are provided and referenced hereafter. It should be noted that the figures are given as examples only and in no way limit the scope of the invention. Like components are denoted by like reference numerals.

DETAILED DESCRIPTION OF EMBODIMENTS OF THE INVENTION

Figure 1:
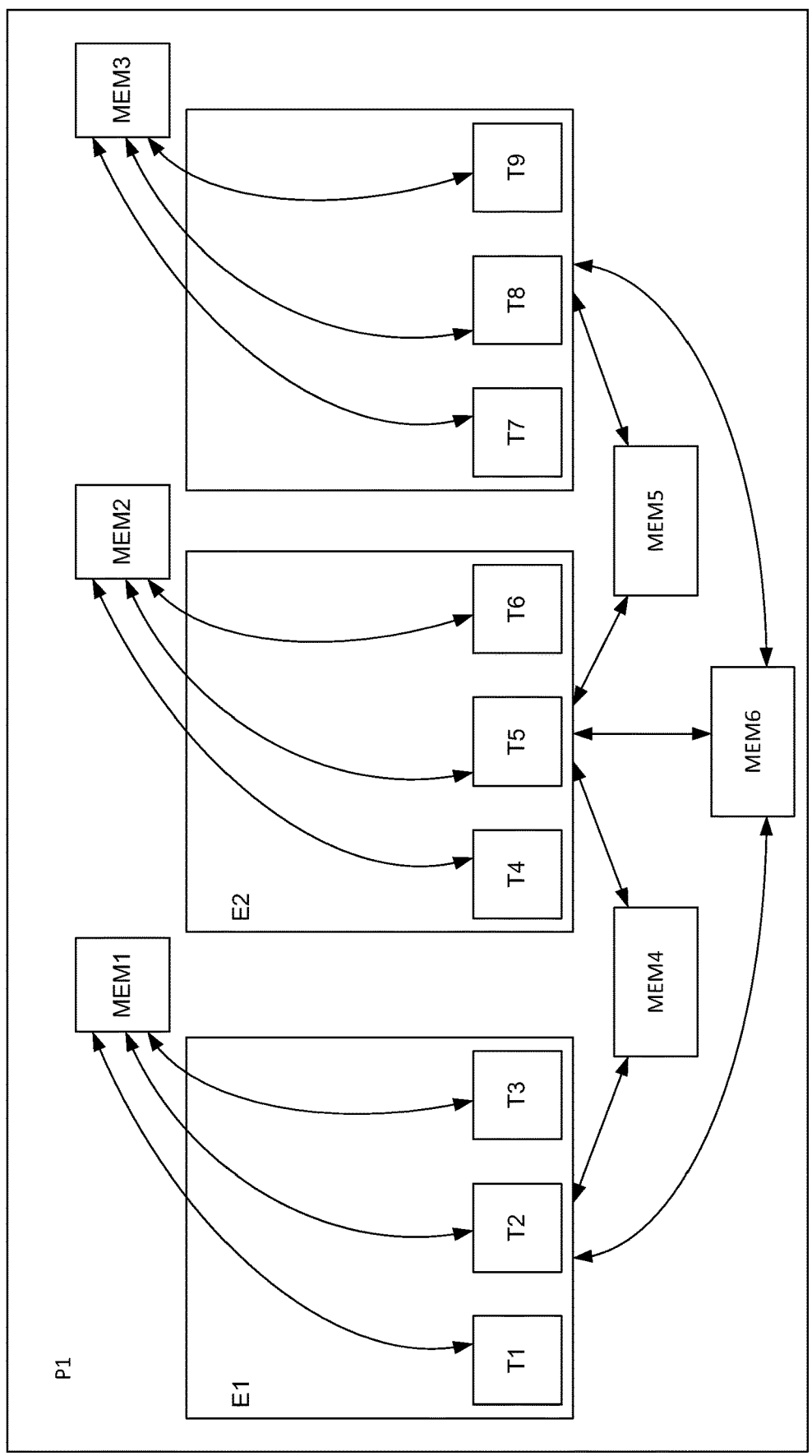
FIG. 1 is a schematic illustration of a program P1, with several executables with their shared memories.

In the following detailed description, numerous specific details are set forth in order to provide a thorough understanding of the methods and systems. However, it will be understood by those skilled in the art that the present methods and systems may be practiced without these specific details. In other instances, well-known methods, procedures, and components have not been described in detail so as not to obscure the present methods and systems.

Although the examples disclosed and discussed herein are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. Unless explicitly stated, the method examples described herein are not constrained to a particular order or sequence. Additionally, some of the described method examples or elements thereof can occur or be performed at the same point in time.

Unless specifically stated otherwise, as apparent from the following discussions, it is appreciated that throughout the specification, discussions utilizing terms such as "adding", "associating" "selecting," "evaluating," "processing," "computing," "calculating," "determining," "designating," "allocating" or the like, refer to the actions and/or processes of a computer, computer processor or computing system, or similar electronic computing device, that manipulate, execute and/or transform data represented as physical, such as electronic, quantities within the computing system's registers and/or memories into other data similarly represented as physical quantities within the computing system's memories, registers or other such information storage, transmission or display devices.

An electronic system (e.g., a smartphone) may typically be made up of a plurality of electronic devices (e.g., memory, camera, central processing unit—CPU, graphical processing unit—GPU, microphone, media player, etc.). At the early stages in the development of electronic design, a model of each of the electronic devices that form the electronic system can be built (typically in Verilog or other HDL language and verified, by simulating executions of a multitude of tests on the on a simulation of the device under test (DUT). In order to, for example, efficiently cover all (or substantially all) functionalities of the DUT a plurality of tests can be generated. The plurality of tests can be pieces of code, e.g., C-code, assembly, and/or other codes as are known in the art. Each of the plurality of tests can be generated from one of various scenarios which can be constructed by a one or a plurality of users. Each scenario can be made up of a plurality of actions which the user selects to be included in the scenario. The user may also define the order in which the selected actions are to be performed—consecutively or concurrently.

An electronic design automation (EDA) tool may allow a user to view an abstract presentation of a scenario or to construct and rearrange the scenario by dragging actions (actually symbols of such actions) from a set of available actions into a designated space in a graphical user interface, defining the relations between the selected actions (the order in which they are to be performed—e.g., sequentially or in parallel), to define a scenario. Typically, the abstract presentation of the scenario is in the form of a graph, e.g., a directed graph, where actions of the scenario are vertices (nodes) and are connected by directed edges.

A scenario may include, for example, a set of actions put together by a validation expert (hereinafter—"user") that is to be tested on the DUT. A validated scenario that complies with system requirements and with test requirements—may be converted into a test by generating executable code, such as, for example, C-code or Assembly. That test may be fed to the DUT in the validation process to test its design.

A thread in computing can refer to a sequence of instructions in a program that may be executed on a single scheduler (e.g., a core of a processor). An executable program, or executable code—and in many cases just "executable", "process" or "binary" (hereinafter referred to as "executable") can be described as a computing entity that is designed to cause the computer perform various tasks. Typically an executable includes one of a plurality of threads.

Typically, each executable is assigned some memory (e.g., defined by addresses in virtual memory), which may be accessed by any of its threads.

FIG. 1 is a schematic illustration of an executable program P1, with several executables with their shared memories, according to some embodiments of the present invention. In the program P1 of this example there are three executables, E1, E2 and E3, each assigned its own memory—E1 is assigned MEM1, E2 is assigned MEM2 and E3 is assigned MEM4. The threads in each executable may address the same assigned memory, thus may share information easily. For example, threads T1, T2 and T3 may share MEM1 and are capable of sharing data that is saved in MEM1 memory Similarly, threads T4, T5 and T6 may share MEM2 and are capable of sharing data MEM2 saved in that memory, and threads T7, T8 and T9 may share MEM3 and are capable of sharing data that is saved in MEM3 memory. However, in order to allow threads in one executable to share data with threads in another executable, a user may be required to allocate (e.g., configure) shared memory for several executables. For example, MEM4 may be configured to be shared by threads of E1 and threads of E2, MEM5 may be configured to be shared by threads of E2 and E3, and MEM6 may be configured to be shared by the threads of E1, E2 and E3.

Figure 2:
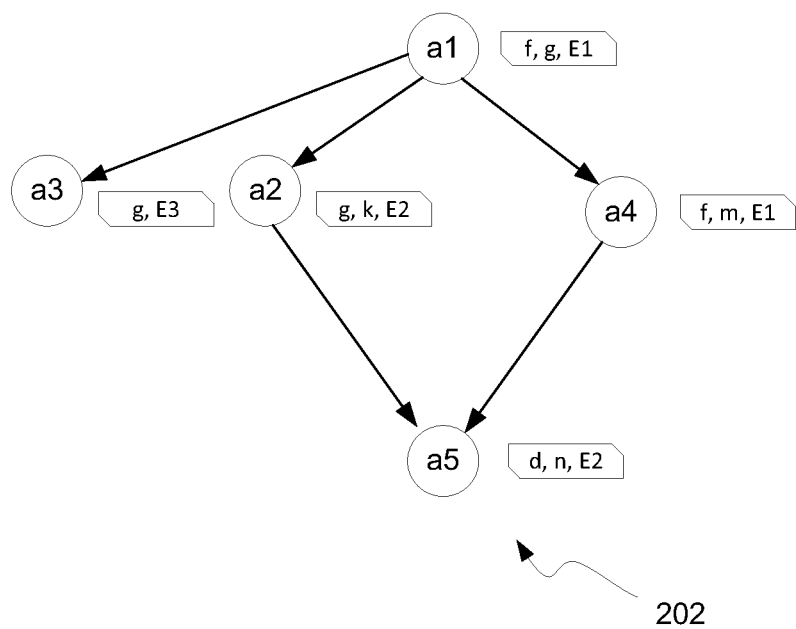
FIG. 2 is a schematic representation of a validated scenario for use in testing of a system (e.g., system on chip), according to some embodiments of the present invention.

FIG. 2 shows a validated scenario (e.g., a solution), which may be constructed automatically or by a user, using a validation tool, according to some embodiments of the invention.

According to some embodiments, in the process of generating validation tests, a validated scenario, e.g., as presented in its abstract form in a validation tool, may be analyzed to identify executables and variables relating to each of the actions.

In the example shown in FIG. 2, solution 202 may include actions a1, a2, a3, a4 and a5, which relate to each other in the following manner: a1 is the earliest action, and is related to executable E1. Actions a2, a3 and a4 are to be executed after the execution of a1 is completed, and action a5 is to be executed after the executions of a2 and a4 are completed. In terms of the flow of the actions in this solution, a2, a4 and perhaps also a3 may be considered as concurrently executed.

Each action relates to an executable (to a thread in an executable) and may have one or more variables assigned to that action. This information may be retrieved, for example, by parsing code relating to a validated scenario (e.g., code generated by a validation tool, corresponding to the abstract presentation of the validated scenario), or by obtaining this information from the user. In some embodiments of the present invention information on the identified variables and executables relating to each action may be presented to a user in a user interface (e.g., displayed on a screen) together with a graphical presentation of the validated scenario (e.g., as shown in FIG. 2).

Some of the variables may relate to a single executable, and may be stored and handled locally on memory that is allocated for that same executable (hereinafter—local variables). Some of the variables may relate to different executables, and therefore require storing and handling on a shared memory allocated for shared use by the different executables (hereinafter—global variables). According to some embodiments of the present invention, a process for generating validation tests may also include identifying global variables in the identified variables that relate to different executables of the identified executables.

In solution 202 (FIG. 1) actions a1 and a4 relate to the same executable E1. Actions a1 and a4 also relate to the same variable—f, while a1 also relates to variable g, and a4 also relates to variable m. Action a2 and a5 relate to the same executable E2, but do not share variables to which they relate. Action a2 relates to variables g and k, and action a5 relates to variables d and n. Action a2 and action a3 relate to different executables (E2 and E3 respectively), but relate to the same variable g.

A process for generating validation tests, according to some embodiments of the present invention, may also include generating test code for the validated scenario that includes access protection commands to manage access to the global variables in allocated shared memory.

The access of actions relating to the same executable to a variable handled by memory allocated to that executable may be controlled and successfully handled without further intervention.

Access protection may be needed to avoid memory access conflicts when actions relating to different executables attempt to access the same variable, handled by a shared memory.

A "lock" function can be described as an access management command designed to enforce limitations on access to a resource. A "lock" can be designed to enforce a mutual exclusion concurrency control policy.

For example, there can be several types of "lock" commands that are designed to restrict access and/or use of a resource under certain conditions and in a certain manner.

An "exclusive lock" command, typically associated with "write" actions, can cause a resource to become exclusively available to one addressing action, while preventing any other concurrent action from accessing that resource. A "shared lock" initially locks the resource to allow the locking action to access that resource but allows a plurality of actions, later, to access the resource. If one or more shared locks exist, exclusive locks may not be obtained. In some embodiments, only after a "free" command is issued the exclusively locked resource becomes available for access again. In some embodiments, if a resource is exclusively locked, the shared locks command or other exclusive locks command cannot be obtained.

According to some embodiments of the present invention, there may be several situations in which different actions may require access to the same variable handled by a shared memory, as detailed below.

A. The different actions relate to the same executable (for example a1 and a4 in FIG. 2, that relate to executable E1 and relate to a common variable f), in which case access management is taken care (with respect to the shared memory of that executable);

B. The different actions relate to different executables, but are not executed concurrently rather sequentially (one action is executed and completed before the other action commences), in which case there is no need for access management commands.

C. The different actions relate to different executables and are to be executed concurrently, but all of these actions relate to "read" commands, in which case there is no need for access management commands.

D. The different actions relate to different executables and are to be executed concurrently, with a one or a plurality of "read" commands" and one "write" command, in which case access management command may be necessary, e.g., "lock" command associated with the "read" command.

E. The different actions relate to different executables and are to be executed concurrently, with a plurality "write" command, in which case access management command may be necessary, e.g., "exclusive lock" and a corresponding "release" command.

Figure 3:
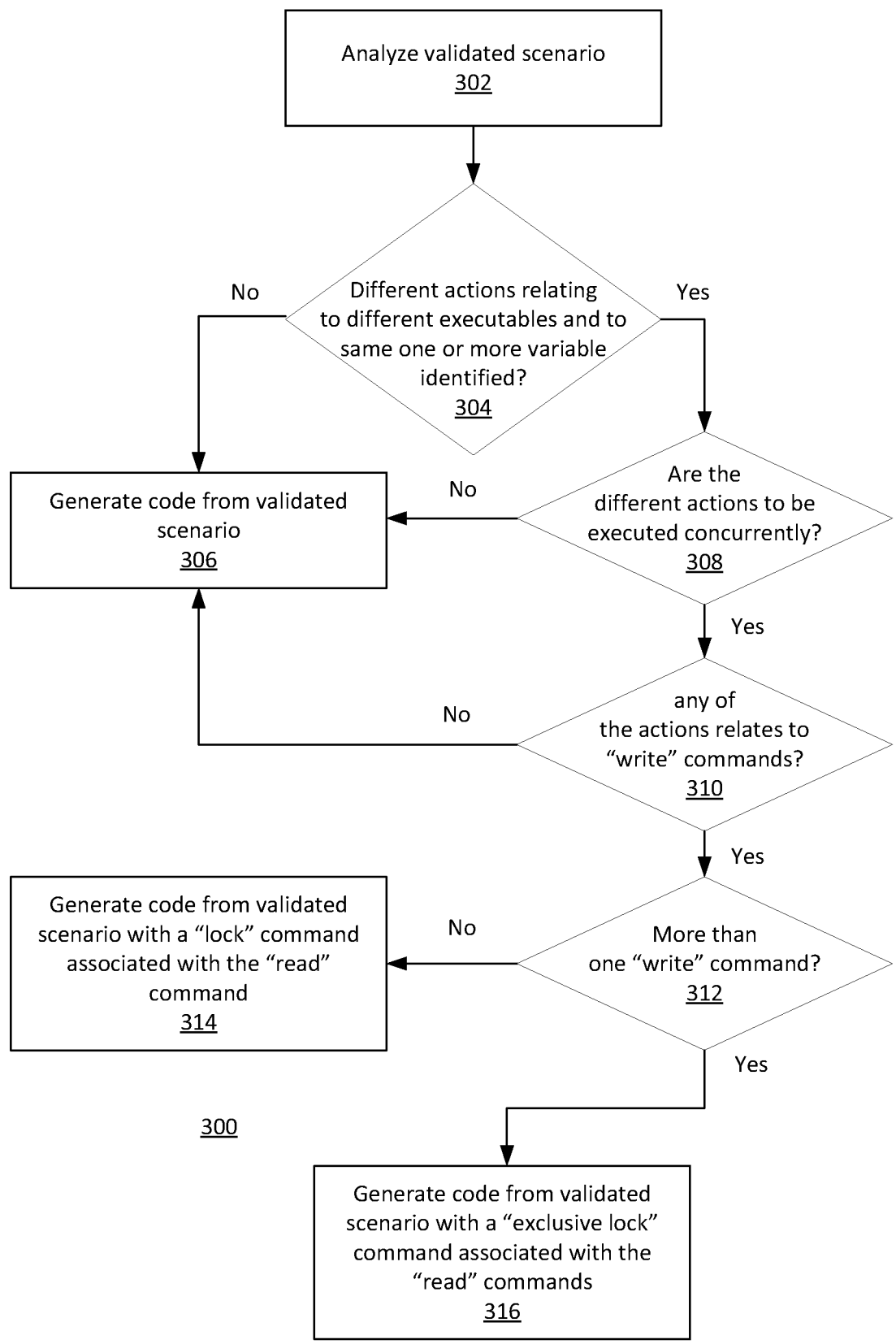
FIG. 3 is a flow diagram of a method for generating a test code for testing an electronic design, according to some embodiments of the present invention.

FIG. 3 is a flow diagram of a method 300 for generating a test code for testing an electronic design, according to some embodiments of the present invention.

Method 300 may include analyzing 302 a validated scenario, in order to determine 304 whether the validated scenario includes actions relating to different executables that relate to the same one or a plurality of variables. If there are no actions relating to different executables that relate to the same one or a plurality of variables, then a test code is generated 306 for the validated scenario. If there are actions relating to different executables that relate to the same one or a plurality of variables then it is determined 308 whether these actions are to be executed concurrently. If not, then a test code is generated 306 for the validated scenario. If there are such actions that are to be executed concurrently, then it is determined 310 whether there is any "write" command among these actions. If there is no "write" command relating to any of these actions, then a test code may be generated 306 form the validated scenario. If the is a "write" command, then it is determined 312 whether there are more than just one "write" commands. If there is only one "write" command, then a test code with a "lock" command associated with the "write" command is generated 314. If there are more than one "write" commands, then a test code with a "exclusive lock" command associated with each of the "write" commands is generated 316.

Figure 4:
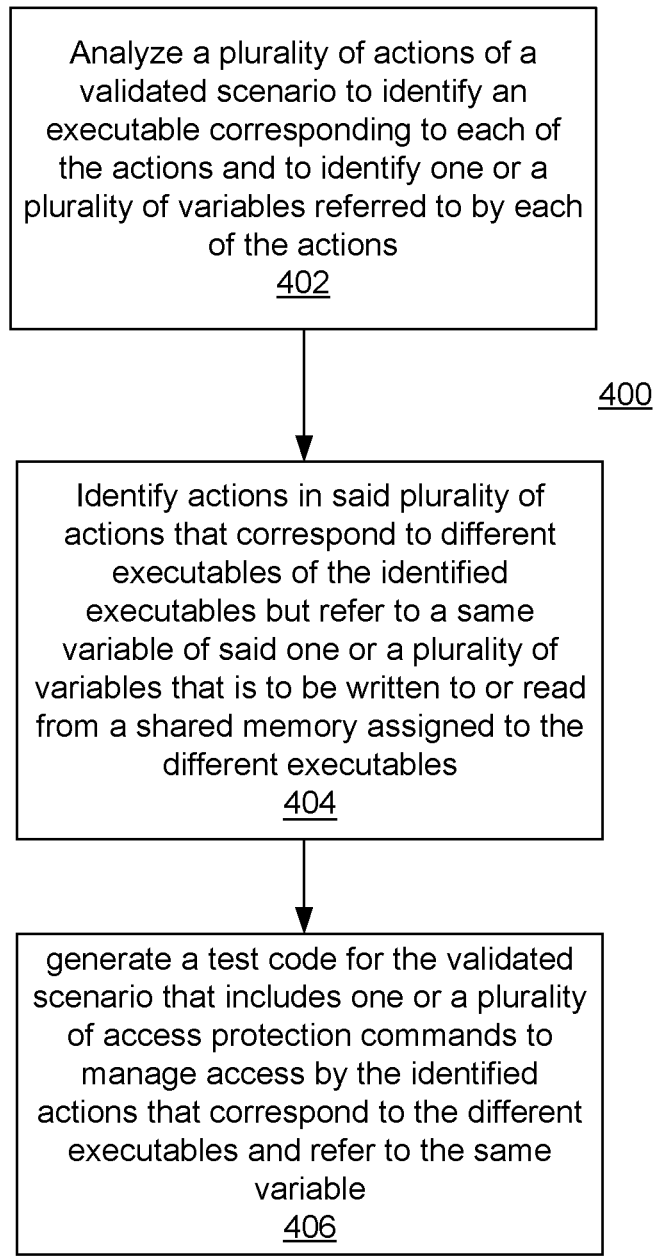
FIG. 4 is a diagram of a method for generating a verification test, according to some embodiments of the present invention.

FIG. 4 is a general flow diagram of a method 400 for generating a test code for testing an electronic design, according to some embodiments of the present invention.

Method 400 may include, using a processor, analyzing 402 a plurality of actions of a validated scenario to identify an executable corresponding to each of the actions and to identify one or a plurality of variables referred to by each of the actions. Method 400 may also include using a processor, identifying 404 actions in said plurality of actions that correspond to different executables of the identified executables but refer to a same variable of said one or a plurality of variables that is to be written to or read from a shared memory assigned to the different executables. Method 400 may also include using a processor, generating 406 a test code for the validated scenario that includes one or a plurality of access protection commands to manage access by the identified actions that correspond to the different executables and refer to the same variable.

According to some embodiments of the invention, the validated scenario is a graphical presentation, such as in the form of a graph, e.g., a directed graph.

According to some embodiments of the invention, the method for generating a verification includes allocating the shared memory for the different executables. This may be performed, for example, by a user, e.g., the verification expert, or other person.

According to some embodiments of the invention, the one or a plurality of access protection commands are included in the test code if the identified actions are to be executed concurrently. Actions that are executed successively, and relate to "read" or "write" commands are not likely to encounter conflicting commands relating to a specific variable (in a specific location in memory). But if the identified actions are to be performed concurrently, there may be a risk of conflicting calls to a certain address in memory, which may require access management.

Typically, when a plurality of "read" calls relate to a single address in memory, this may not pose a real conflict. But if there is a possibility of concurrent "write" command and "read" command a conflict may arise.

According to some embodiments of the invention, the one or a plurality of access protection commands are included in the test code if one of the identified actions relates to a "write" command. A "lock" command can resolve this potential conflict.

According to some embodiments of the invention, the one or a plurality of access protection commands includes a "lock" command.

When there are more than one concurrent actions that relate to "write" commands, a "lock" command may not be sufficient to prevent conflicts, so "exclusive lock" and corresponding "release" commands may be used.

According to some embodiments of the invention, the one or a plurality of access protection commands are included in the test code if more than one of the identified actions relates to a "write" command, and the one or a plurality of access protection commands include an "exclusive lock" command and a corresponding "release" command.

Figure 5:
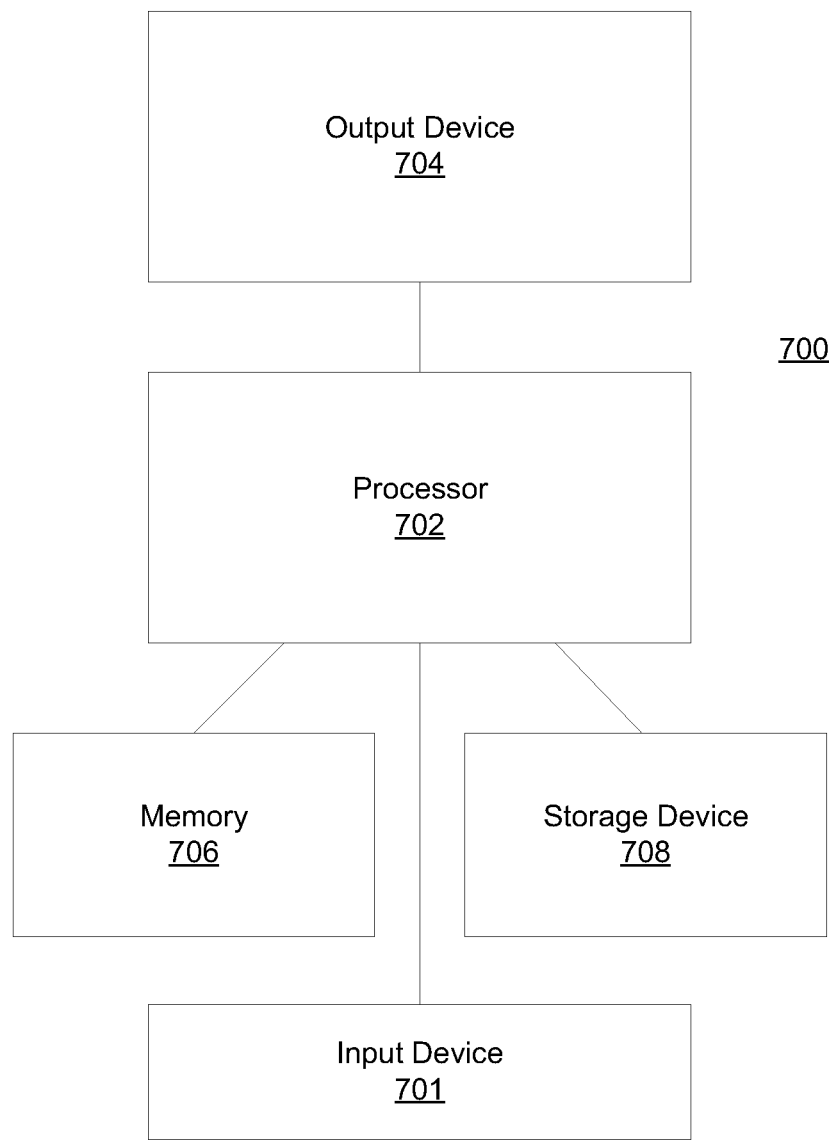
FIG. 5 illustrates a system for generating a validation test, according to some embodiments of the present invention.

FIG. 5 illustrates a system 700 for generating validation tests, according to some embodiments of the present invention. System 700 may include a processor 702 (e.g. single processor or a processing unit made that includes a plurality of processors, on a single machine or distributed on a plurality of machines) for executing a method according to some embodiments of the present invention. Processing unit 702 may be configured to analyze a validated scenario that includes a plurality of actions to identify executables and variables relating to each of the actions; to identify actions in the plurality of actions that relate to different executables and refer to a same variable of said variables that is to be written to or read from a shared memory assigned to the different executables; and to generate a test code for the validated scenario that includes one or a plurality of access protection commands to manage access by the actions that relate to the different executables and refer to the same variable.

In accordance with some embodiments of the present invention, the process of generating test code for verification may become more automated, freeing the user from having to manually review generated test code to determine whether access management commands have to be added to the code. Not only is such work a tedious job, but a human user is typically unable to effectively cover large code files and thus error may result that may result in significant waste of resources (human time and computing resources), which may be saved by employing systems and methods according to some embodiments of the present invention. Furthermore, automatically including access management commands in the code may free the programmers from some planning considerations when allocating memory for the DUT, or at least reduce some of these considerations and therefore has the potential to shorten verification time and to render the verification process more efficient.

Processor 702 may be linked with memory 706 on which a program implementing a method according to some embodiments of the present invention and corresponding data may be loaded and run from, and storage device 708, which includes a non-transitory computer readable medium (or mediums) such as, for example, one or a plurality of hard disks, flash memory devices, etc. on which a program implementing a method according to some embodiments of the present invention and corresponding data may be stored. System 700 may further include an output device 704 (e.g. display device such as CRT, LCD, LED etc.) on which one or a plurality user interfaces associated with a program implementing a method according to some embodiments of the present invention and corresponding data may be presented. System 700 may also include input interface 701, such as, for example, one or a plurality of keyboards, pointing devices, touch sensitive surfaces (e.g. touch sensitive screens), etc. for allowing a user to input commands and data.

Some embodiments of the present invention may be embodied in the form of a system, a method or a computer program product. Similarly, some embodiments may be embodied as hardware, software or a combination of both. Some embodiments may be embodied as a computer program product saved on one or more non-transitory computer readable medium (or media) in the form of computer readable program code embodied thereon. Such non-transitory computer readable medium may include instructions that when executed cause a processor to execute method steps in accordance with examples. In some examples the instructions stores on the computer readable medium may be in the form of an installed application and in the form of an installation package.

Such instructions may be, for example, loaded by one or more processors and get executed.

For example, the computer readable medium may be a non-transitory computer readable storage medium. A non-transitory computer readable storage medium may be, for example, an electronic, optical, magnetic, electromagnetic, infrared, or semiconductor system, apparatus, or device, or any combination thereof.

Computer program code may be written in any suitable programming language. The program code may execute on a single computer system, or on a plurality of computer systems.

Some embodiments are described hereinabove with reference to flowcharts and/or block diagrams depicting methods, systems and computer program products according to various embodiments.

Features of various embodiments discussed herein may be used with other embodiments discussed herein. The foregoing description of the embodiments has been presented for the purposes of illustration and description. It is not intended to be exhaustive or limiting to the precise form disclosed. It should be appreciated by persons skilled in the art that many modifications, variations, substitutions, changes, and equivalents are possible in light of the above teaching. It is, therefore, to be understood that the appended claims are intended to cover all such modifications and changes that fall within the true spirit of the present invention.

The invention claimed is:

1. A method for generating a validation test, the method comprising:
   obtaining, by a processor, a validated scenario, the validated scenario comprising a plurality of actions to be tested on a device under test;
   using the processor, analyzing the plurality of actions of the validated scenario to identify an executable corresponding to each of the actions and to identify one or a plurality of variables referred to by each of the actions, wherein each executable comprises a computing entity that is designed to cause the device under test to perform various tasks;
   using the processor, identifying actions in said plurality of actions that correspond to different executables of the identified executables but refer to a same variable of said one or a plurality of variables that is to be written to or read from a shared memory assigned to the different executables;
   using the processor, generating a test code for the validated scenario; and
   using the processor, including in the test code one or a plurality of access protection commands to manage access by the identified actions that correspond to the different executables and refer to the same variable.

2. The method of claim 1, wherein the validated scenario is in the form of a directed graph.

3. The method of claim 1, further comprising allocating the shared memory for the different executables.

4. The method of claim 1, wherein said one or a plurality of access protection commands are included in the test code if the identified actions are to be executed concurrently.

5. The method of claim 4, wherein said one or a plurality of access protection commands are included in the test code if one of the identified actions relates to a "write" command.

6. The method of claim 5, wherein said one or a plurality of access protection commands comprises a "lock" command.

7. The method of claim 4, wherein said one or a plurality of access protection commands are included in the test code if more than one of the identified actions relates to a "write" command.

8. The method of claim 7, wherein said one or a plurality of access protection commands comprises an "exclusive lock" command and a corresponding "release" command.

9. A non-transitory computer readable storage medium for generating a validation test, having stored thereon instructions that when executed by a processor will cause the processor to:
   obtain a validated scenario, the validated scenario comprising a plurality of actions to be tested on a device under test;
   analyze the plurality of actions of the validated scenario to identify an executable corresponding to each of the actions and to identify one or a plurality of variables referred to by each of the actions, wherein each executable comprises a computing entity that is designed to cause the device under test to perform various tasks;
   identify actions in said plurality of actions that correspond to different executables of the identified executables but refer to a same variable of said one or a plurality of variables that is to be written to or read from a shared memory assigned to the different executables;
   generate a test code for the validated scenario; and
   include in the test code one or a plurality of access protection commands to manage access by the identified actions that correspond to the different executables and refer to the same variable.

10. The non-transitory computer readable storage medium of claim 9, wherein the validated scenario is in the form of a directed graph.

11. The non-transitory computer readable storage medium of claim 9, wherein the instructions when executed by a processor will further cause the processor to obtain allocation of the shared memory for the different executables.

12. The non-transitory computer readable storage medium of claim 9, wherein said one or a plurality of access protection commands are included in the test code if the identified actions are to be executed concurrently.

13. The non-transitory computer readable storage medium of claim 9, wherein said one or a plurality of access protection commands are included in the test code if one of the identified actions relates to a "write" command.

14. The non-transitory computer readable storage medium of claim 13, wherein said one or a plurality of access protection commands comprises a "lock" command.

15. The non-transitory computer readable storage medium of claim 12, wherein said one or a plurality of access protection commands are included in the test code if more than one of the identified actions relates to a "write" command.

16. The non-transitory computer readable storage medium of claim 15, wherein said one or a plurality of access protection commands comprises an "exclusive lock" command and a corresponding "release" command.

17. A system for generating a validation test, the system comprising:
    a memory; and
    a processor configured:
       obtain a validated scenario, the validated scenario comprising a plurality of actions to be tested on a device under test;
       to analyze the plurality of actions of the validated scenario to identify an executable corresponding to each of the actions and to identify one or a plurality of variables referred to by each of the actions, wherein each executable comprises a computing entity that is designed to cause the device under test to perform various tasks;
       to identify actions in said plurality of actions that correspond to different executables of the identified executables but refer to a same variable of said one or a plurality of variables that is to be written to or read from a shared memory assigned to the different executables;
       to generate a test code for the validated scenario; and
       to include in the test code one or a plurality of access protection commands to manage access by the identified actions that correspond to the different executables and refer to the same variable.

18. The system of claim 17, wherein said one or a plurality of access protection commands are included in the test code if the identified actions are to be executed concurrently.

19. The system of claim 18, wherein said one or a plurality of access protection commands are included in the test code if one of the identified actions relates to a "write" command, and wherein said one or a plurality of access protection commands comprises a "lock" command.

20. The system of claim 18, wherein said one or a plurality of access protection commands are included in the test code if more than one of the identified actions relates to a "write" command, and wherein said one or a plurality of access protection commands comprises an "exclusive lock" command and a corresponding "release" command.

\* \* \* \* \*